(12) United States Patent
Hu et al.

(10) Patent No.: US 9,443,745 B2
(45) Date of Patent: Sep. 13, 2016

(54) METHOD FOR SETTING COATING MODULE QUANTITY AND ROBOT SPEED

(71) Applicant: KINGSEMI CO., LTD., Shenyang (CN)

(72) Inventors: Yanbing Hu, Shenyang (CN); Wei Feng, Shenyang (CN)

(73) Assignee: KINGSEMI CO., LTD., Shenyang (CN)

( * ) Notice: Subject to any disclaimer, the term of this patent is extended or adjusted under 35 U.S.C. 154(b) by 0 days.

(21) Appl. No.: 14/395,379

(22) PCT Filed: Apr. 16, 2014

(86) PCT No.: PCT/CN2014/075452
§ 371 (c)(1),
(2) Date: Oct. 17, 2014

(87) PCT Pub. No.: WO2015/062214
PCT Pub. Date: May 7, 2015

(65) Prior Publication Data
US 2015/0303076 A1    Oct. 22, 2015

(30) Foreign Application Priority Data
Oct. 29, 2013   (CN) .......................... 2013 1 0526288

(51) Int. Cl.
*H01L 21/67* (2006.01)
*G03F 7/30* (2006.01)

(52) U.S. Cl.
CPC ................ *H01L 21/67* (2013.01); *G03F 7/30* (2013.01); *G05B 2219/39068* (2013.01)

(58) Field of Classification Search
CPC ......... H01L 21/00; H01L 21/67; G03F 7/30; G05B 2219/39068
See application file for complete search history.

(56) References Cited

U.S. PATENT DOCUMENTS

2008/0051930 A1* 2/2008 Oh .................... H01L 21/67276 700/214
2009/0098298 A1* 4/2009 Miyata .............. H01L 21/67276 427/372.2

FOREIGN PATENT DOCUMENTS

CN    101615562    12/2009
CN    103199032    7/2013

OTHER PUBLICATIONS

International Search Report for International Application No. PCT/CN2014/075452 dated Jun. 26, 2014 (Chinese with English translation) (6 pages).

*Primary Examiner* — Yuen Wong
(74) *Attorney, Agent, or Firm* — Smith, Gambrell & Russell, LLP

(57) ABSTRACT

The present invention relates to developing and design a coater & developer with high throughput that in-line with lithograph equipment during integrated circuit production, which needs to reasonably set the quantity of processing modules and the transfer speed of robots in the coater & developer. The present invention provides a method for setting the quantity of the processing modules and the transfer speed of the robots in the coater & developer, including steps of determining the processing time parameter of the coater & developer according to the target throughput, and designing the processing periodic time parameter of each processing module and the transfer periodic time parameter of each wafer transfer robot in the coater & developer make the three time parameters tend to consistency.

8 Claims, 1 Drawing Sheet

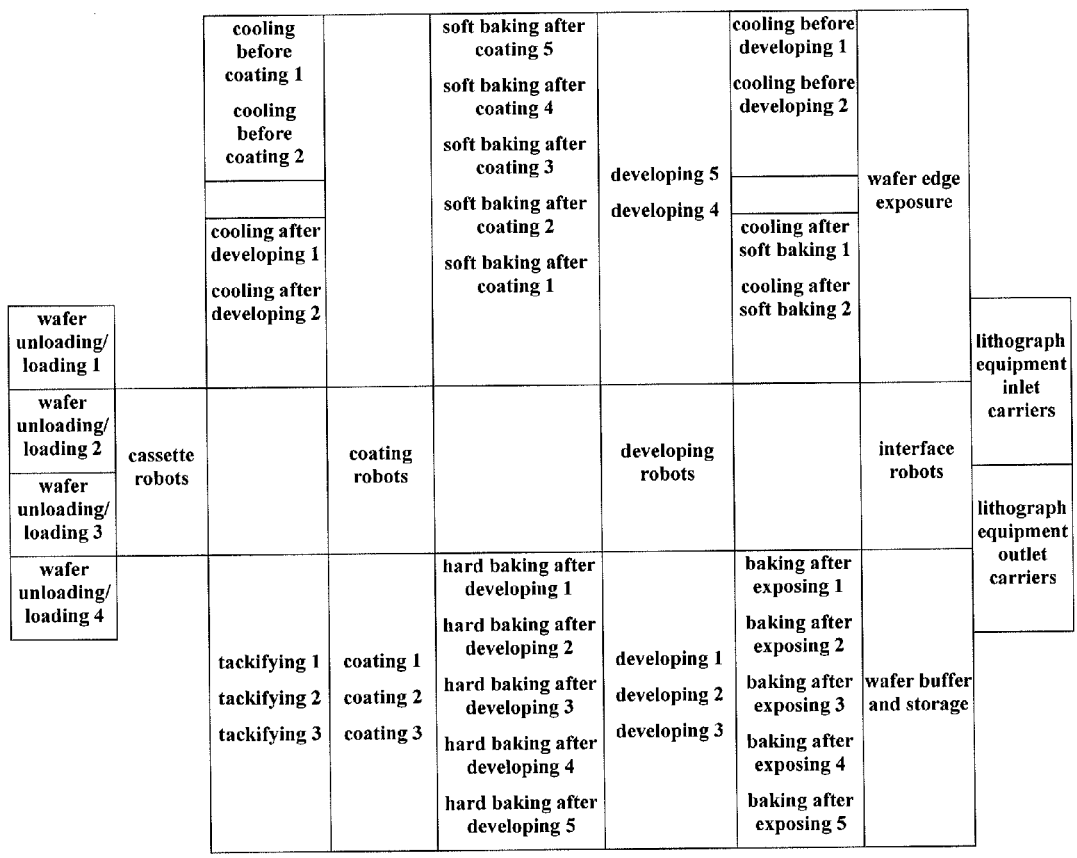

METHOD FOR SETTING COATING MODULE QUANTITY AND ROBOT SPEED

TECHNICAL FIELD OF THE INVENTION

The present invention relates to the technical field of semiconductors, specifically to a method for setting the quantity of processing modules and the transfer speed of robots in coater and developer during developing and design of the coater and developer tool.

BACKGROUND OF THE INVENTION

At present, large-scale integrated circuit production lines require that the coater and developer in-line with lithograph equipment have high throughput which is higher than that of the lithograph equipment. This high throughput coater&developer in-line with the lithograph equipment mainly have the functions of coating photoresist in the tool after unloading wafers from cassette, then transferring wafers into lithograph equipment to dealing with exposing process via the interface unit, after that, transferring wafer via interface unit hack to coater & developer for developing process, and finally re-loading the wafers in cassette.

The coater & developer mainly completes the main processes including tackifying before coating, coating, soft baking after coating, baking after exposing, developing, and hard baking after developing, so the coater&developer has various processing modules and wafer transfer robots.

The throughput of the coater & developer mainly depends on the throughput of the processing modules, quantity of the processing modules, wafer transfer speed of the robots, wafer transfer path, structures and layout of the processing modules therein, and those factors have certain influences on each other. To design the coater & developer, the above factors and mutual relationships thereof shall be taken into full consideration, and then the developing and design of high cost-performance products can succeed.

SUMMARY OF THE INVENTION

To develop and design high throughput coater & developer in-line with the lithograph equipment, the quantity of processing modules and the transfer speed of robots in the coater & developer shall be set reasonably. The present invention provides a method for setting the quantity of the processing modules and the transfer speed of the robots in the coater & developer, which comprises steps of determining the processing time parameter of the coater & developer according to the target throughput and designing the processing periodic time parameter of each processing module and the transfer periodic time parameter of each wafer transfer robot in the coater & developer so as to keep the three time parameters consistent.

in order to realize the above objective, the present invention adopts the following technical solution: A method for setting the quantity of processing modules and the speed of robots in a coater & developer, which comprises the steps of determining the processing time parameter TP of the coater & developer according to the target throughput, and designing the processing periodic time parameter of each processing module and the transfer periodic time parameter of each wafer transfer robot in the coater & developer so as to make the three time parameters tend to consistency.

The process time parameter TP of the coater & developer set according to the target throughput=3,600/target throughput.

The processing periodic time parameter Ta of each processing module in the coater & developer=(processing time of the modules+auxiliary time of the modules) module quantity.

The processing periodic time parameter Tn of each processing module in the coater & developer minimizes the difference Tn and TP by setting the module quantity.

The transfer periodic time parameter Tr of each wafer transfer robot in the coater & developer=the time of wafer transfer between two processing modules×the quantity of types of the processing modules needing the wafer transfer service of the robots The transfer periodic time parameter Tr of each wafer transfer robot in the coater developer minimizes the difference between Tn and TP by setting the time of wafer transfer between two processing modules.

The present invention has the following benefits and advantages:

1. The present invention can set the quantity of the processing modules and the wafer transfer speed with given processing technical requirements, namely the processing time of given modules and the throughput of the entire developer, reducing waste in funds during trial manufacturing and shortening the design and developing cycle.

2. The present invention rationally set the quantity of the processing modules and the wafer transfer speed such that the quantity and the speed are matched with the throughput of the target product and the three form an organic relationship, thus reducing waste in resources and improves the cost performance of the developed product.

DESCRIPTION OF THE DRAWINGS

FIG. 1 is a schematic view of the structure of the developed and designed coater & developer of the present invention.

Wherein, main processing modules includes 11 types, related to the following processes: cooling before coating, cooling after developing, tackifying, coating, soft baking after coating, hard baking after developing, developing, cooling before developing, cooling after soft baking, baking after exposing, and wafer edge exposure;

Auxiliary processing modules include four types: wafer unloading/loading modules, wafer buffer and storage modules, lithograph equipment inlet carriers and lithograph equipment outlet carriers;

Wafer transfer robots include four types: cassette robots, coating robots, developing robots, and interface robots.

DETAILED DESCRIPTION OF THE INVENTION

The present invention is described in further detail with reference to the attached drawings and the embodiment.

Taking developing and design of a coater & developer with a throughput of 150 pieces/h as an example, the coater & developer can work in-line with the lithograph equipment during production.

1. Set the processing time parameter of the coater & developer:

According to the target throughput of 150 pieces/h, the parameter TP=3,600/150=24

2. Design the processing periodic time parameters of modules for the main process links of the coater & developer:

Set the quantity of the corresponding processing modules according to the given processing time and auxiliary time of the main modules in the tool; obtain the parameter value Tn of each processing module according to Tn=(the processing time of the modules+auxiliary time of the modules)/module quantity, ensure that the parameter value approaches the parameter value TP as much as possible; and obtain the throughput value of each processing module according to the processing module throughput=3,600/Tn.

| | Tackifying | Cooling before coating | Glue coating | Soft baking after glue coating | Cooling after soft baking | Wafer edge exposure | Baking after exposing | Cooling before developing | Developing | Hard baking after developing | Cooling after developing |
|---|---|---|---|---|---|---|---|---|---|---|---|
| Processing time (s) | 62 | 43 | 60 | 110 | 43 | 17 | 105 | 43 | 108 | 110 | 43 |
| Auxiliary time (s) | 8 | 4 | 10 | 6 | 4 | 6 | 12 | 4 | 10 | 6 | 4 |
| Time sum (s) | 70 | 47 | 70 | 116 | 47 | 23 | 117 | 47 | 1118 | 116 | 47 |
| Module quantity (unit) | 3 | 2 | 3 | 5 | 2 | 1 | 5 | 2 | 5 | 5 | 2 |
| Parameter Tn | 23.3 | 23.5 | 23.5 | 23.2 | 23.5 | 23.0 | 23.4 | 23.5 | 23.6 | 23.2 | 23.5 |
| Module throughput (pieces/h) | 154 | 153 | 154 | 155 | 153 | 157 | 154 | 153 | 153 | 155 | 153 |

3. Design the transfer periodic time parameter of each wafer transfer robot in the coater & developer:

Set the speed of each wafer transfer robot according to the transfer periodic time parameter of each wafer transfer robot, the serving processing module quantity and the specific processing module names of each robot, namely set the time of wafer transfer between two processing modules of the each wafer transfer robot; obtain the parameter value Tr of each wafer transfer robot according to the formula Tr=the time of wafer transfer between two processing modules×the quantity of the serving processing modules of each wafer transfer robot, ensure the parameter value approaches the parameter value TP as much as possible; and obtain the throughput value of each wafer transfer robot according to the wafer transfer robot throughput=3,600/Tr.

| Wafer transfer robot | Cassette robot | Coating robot | Developing robot | Interface robot |
|---|---|---|---|---|
| Types of the processing modules in service | 4 | 6 | 6 | 6 |
| Names of the processing modules | Wafer unloading | Tackifying | Baking after exposing | Cooling after soft baking |
| | Tackifying | Cooling before coating | Cooling before developing | Wafer edge exposure |
| | Cooling after developing | Coating | Developing | Wafer buffer |
| | Wafer loading | Soft baking after coating | Hard baking after developing | Lithograph equipment inlet carrier |
| | | Hard baking after developing | Soft baking after coating | Lithograph equipment outlet carrier |
| | | Cooling after hard baking | Cooling after soft baking | Baking after exposing |
| Transfer | 5.9 | 3.9 | 3.9 | 1.9 |
| time (s) between two modules | | | | |
| Parameter Tr | 23.6 | 23.4 | 23.4 | 23.4 |
| Speed (pieces/h) of the wafer transfer robot | 153 | 154 | 154 | 154 |

4. Match the three time parameters of the coater & developer:

Set the process time parameter TP as 24 first after clarifying the target throughput of the developed and designed coater & developer, then design the processing periodic time parameter Tn and the transfer periodic time parameter Tr in a range of 23.0-23.6, maintain Tn and Tr in an order of magnitudes such that the throughput of the processing modules is close to the transfer speed of the wafer transfer robots. The parameters Tn and Tr are a little smaller than the parameter value TP, and then the target throughput of the coater & developer can be achieved.

The design method of the present invention can effectively reduce waste in resources during trail manufacturing of the coater & developer, shortens the design and developing cycle and improves the cost performance of the developed product.

What is claimed is:
1. A method of controlling a spreading and developing machine to perform a wafer processing operation, the method comprising
determining a processing time parameter value (TP) of said machine according to a target throughput of said machine, said processing time parameter value (TP) being equal to 3,600 divided by the target throughput of said machine;

setting, for a plurality of processing modules of said machine, a processing periodic time parameter value (Tn), the processing periodic time parameter value (Tn) of each processing module in the plurality of processing modules being set by summing a processing time and an auxiliary time of a respective processing module and dividing the sum by a quantity of the plurality of processing modules that are of the same class as the respective processing module, wherein the processing periodic time parameter value (Tn) is set to a value that minimizes a difference between the processing periodic time parameter value (Tn) and the processing time parameter value (TP);

setting, for a plurality of wafer transfer robots of said machine, a transfer periodic time parameter value (Tr), the transfer periodic time parameter value (Tr) of each wafer transfer robot in the plurality of wafer transfer robots being determined by multiplying a transfer time for a respective wafer transfer robot to transfer a wafer between two processing modules by a quantity of different classes of processing modules that the respective wafer transfer robot serves, wherein the transfer periodic time parameter value (Tr) is set to a value that is within a range defined by a lower end point corresponding with a minimum value set as the processing periodic time parameter value (Tn) among the plurality of processing modules and an upper end point corresponding with a maximum value set as the processing periodic time parameter value (Tn) among the plurality of processing modules;

controlling the plurality of processing modules in accord with the set value of the processing periodic time parameter value (Tn);

controlling the plurality of wafer transfer robots in accord with the set value of the transfer periodic time parameter value (Tr); and performing a spreading and developing operation to a plurality of wafers through use of the plurality of processing modules and the plurality of wafer transfer robots in accord with the processing time parameter value (TP).

2. The method of controlling a spreading and developing machine according to claim 1, wherein:
setting the processing periodic time parameter value (Tn) for each processing module in the plurality of processing modules comprises setting, for use in the wafer processing operation, the quantity of the plurality of processing modules that are of the same class as the respective processing module.

3. The method of controlling a spreading and developing machine according to claim 2, wherein:
setting the transfer periodic time parameter value (Tr) for each wafer transfer robot in the plurality of wafer transfer robots comprises setting the transfer time for the respective wafer transfer robot to transfer a wafer between two processing modules.

4. The method of controlling a spreading and developing machine according to claim 1, wherein:
setting the transfer periodic time parameter value (Tr) for each wafer transfer robot in the plurality of wafer transfer robots comprises setting the transfer time for the respective wafer transfer robot to transfer a wafer between two processing modules.

5. The method of controlling a spreading and developing machine according to claim 1, wherein:
the plurality of processing modules comprises one or more processing modules selected from the group consisting of a cooling before coating module, a cooling after developing module, a tackifying module, a coating module, a soft baking after coating module, a hard baking after developing module, a developing module, a cooling before developing module, a cooling after soft baking module, a baking after exposing module, and a wafer edge exposure module.

6. The method of controlling a spreading and developing machine according to claim 1, wherein:
the plurality of wafer transfer robots comprises one or more wafer transfer robots selected from the group consisting of a cassette robot, a coating robot, a developing robot, and an interface robot.

7. The method of controlling a spreading and developing machine according to claim 1, further comprising:
feeding wafers into said machine for processing via the plurality of processing modules and the plurality of wafer transfer robots in accord with the set values of the processing periodic time parameter value (Tn), the transfer periodic time parameter value (Tr), and the processing time parameter value (TP).

8. The method of controlling a spreading and developing machine according to claim 1, further comprising:
carrying wafers output from said machine by one or more carriers of a lithograph system, wherein carrying of the wafers by the one or more carriers is coordinated with the processing of the wafers by said machine in accord with the processing periodic time parameter value (Tn), the transfer periodic time parameter value (Tr), and the processing time parameter value (TP).

* * * * *